United States Patent
Christenson

(10) Patent No.: US 6,587,918 B1
(45) Date of Patent: Jul. 1, 2003

(54) METHOD FOR CONTROLLING REFRESH OF A MULTIBANK MEMORY DEVICE

(75) Inventor: Leonard E. Christenson, Coon Rapids, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/196,569

(22) Filed: Nov. 19, 1998

(51) Int. Cl.[7] .............................................. G06F 12/00
(52) U.S. Cl. ........................................ 711/106; 711/158
(58) Field of Search ............................... 711/158, 105, 711/106; 365/189, 222, 230.03

(56) References Cited

U.S. PATENT DOCUMENTS

| | | | | |
|---|---|---|---|---|
| 4,796,232 A | * | 1/1989 | House ........................ | 365/189 |
| 4,818,932 A | | 4/1989 | Odenheimer ................ | 324/121 |
| 5,627,791 A | * | 5/1997 | Wright et al. ............... | 365/222 |
| 5,636,173 A | * | 6/1997 | Schaefer ................ | 365/230.03 |
| 5,796,669 A | * | 8/1998 | Araki et al. ................ | 365/222 |
| 5,907,857 A | * | 5/1999 | Biswas ....................... | 711/106 |
| 5,920,898 A | | 7/1999 | Bolyn et al. ................ | 711/167 |
| 5,940,342 A | * | 8/1999 | Yamazaki et al. ...... | 365/230.03 |
| 6,000,007 A | * | 12/1999 | Leung et al. ............... | 711/105 |
| 6,018,793 A | | 1/2000 | Rao ............................ | 711/150 |
| 6,046,953 A | * | 4/2000 | Kiehl et al. ................ | 365/222 |
| 6,075,744 A | * | 6/2000 | Tsern et al. ............ | 365/230.03 |
| 6,134,169 A | * | 10/2000 | Tanaka ........................ | 365/222 |

* cited by examiner

*Primary Examiner*—David Hudspeth
*Assistant Examiner*—Fred F. Tzeng
(74) *Attorney, Agent, or Firm*—Dorsey & Whitney LLP

(57) ABSTRACT

A method is described for controlling refresh of a multibank DRAM. A refresh request and associated address are generated external to the DRAM. DRAM refresh operations are initiated in one bank while data transfer operations are being executed in another bank. The refresh request is handled much like a memory read request, with the associated read data being ignored. In one implementation, the refresh request is given priority over any other pending memory access request. By initiating refresh operations without first waiting for all DRAM banks to be precharged, the significant time penalties associated with the prior art are avoided.

26 Claims, 6 Drawing Sheets

METHOD FOR CONTROLLING REFRESH OF A MULTIBANK MEMORY DEVICE

TECHNICAL FIELD

The present invention relates generally to circuitry and protocols associated with operating a memory device, and more particularly, to methods for controlling refresh operations in a dynamic random access memory device.

BACKGROUND OF THE INVENTION

FIG. 1 is a simplified functional block diagram of a memory device 200 that represents any of a wide variety of currently available memory devices. The central memory storage unit is a memory array 202 that is arranged in a plurality of banks, with two such banks 204A and 204B shown. The memory array 202 includes a plurality of individual memory elements (not shown) for storing data, with the memory elements commonly arranged in separately addressable rows and columns, as is well known.

Particular locations within the memory array 202 are addressable by Address signals that external circuitry such as a memory controller (not shown) provides to the memory device 200. The memory controller also provides a plurality of Control or command signals that are used to designate the particular memory access type and/or sequence of memory accesses. As depicted in FIG. 1, a control/address logic circuit 206 receives the Control and Address signals, which may be provided in parallel signal paths, serially, or some suitable combination. The control/address logic circuit 206 then applies a plurality of internal control signals to control the timing and sequence of operations accessing the banks 204A and 204B via access circuits 208A and 208B, respectively. Those skilled in the art will understand that the depicted access circuits 208A and 208B represent a collection of various functional circuit components commonly found in memory devices. Examples include row and column address latch, buffer, and decoder circuits, sense amplifiers and I/O gating circuitry, and other well-known circuits adapted for particular memory device implementations.

Data written to and read from the memory array 202 is transferred from and to the memory controller or other external circuitry via a data I/O circuit 210 and the access circuits 208A and 208B. Those skilled in the art will also understand that the depicted data I/O circuit 210 represents a collection of various functional circuit components adapted to transmit data to or receive data from external circuitry and to correspondingly receive read data from or transmit write data to the array 202 via the access circuits 208A and 208B.

As known to those skilled in the art data stored in dynamic random access memories (DRAMs) deteriorates with time and must be periodically "refreshed" to maintain accurate data. The control/address logic circuit 206 then includes a refresh control/address circuit 212 that provides the necessary control signals and address information to refresh the data contents of the array 202. Operation of the refresh control/address circuit 212 is commonly initiated in response to a command from the memory controller, such as the well known Auto Refresh command.

The memory device 200 depicted in FIG. 1 exemplifies multibank DRAMs, such as synchronous DRAMs (SDRAMs) and packet-oriented DRAMs (known as SLDRAMs). SDRAMs, commonly have two array banks, and SLDRAMs commonly have eight array banks. Providing multiple banks improves the average speed with which a sequence of memory operations can be performed. When access to a particular array bank is complete, a "precharge" operation is performed to prepare the corresponding access circuitry for a subsequent data transfer operation with the array bank. The precharge operation requires a certain amount of time for its completion, and therefore limits the speed with which a sequence of memory operations can be performed to a particular array bank. By organizing the memory array to have multiple banks with associated access circuits, the precharge time can, in some instances, be "hidden." For example, if a first access is to bank 204A and a subsequent access is to bank 204B, precharge operations associated with bank 204A can occur while initiating memory access operations to bank 204B.

Initiation of Auto Refresh operations cannot occur, however, until the memory device 200 is idle—namely, no memory operations are occurring and all array banks and associated access circuits have been precharged. Thus, while providing a multiple bank configuration can improve data transfer speeds for some sequences of memory operations, refresh operations still adversely effect data transfer rates.

Referring to FIG. 2, a timing diagram depicts the operation of an SLDRAM in accordance with the prior art. As is known to those skilled in the art, control and address information is provided to the SLDRAM as a sequence of packets, each of which is registered at a clock "tick" (a rising or falling edge of a command clock signal). The timing diagram depicts commands provided as a sequence of four packets of control/address information CA0–CA9. The commands are registered at times referenced to the command clock signal CCLK, and the data input to or output from the SLDRAM is a sequence of four packets of data DQ0–DQ17.

Referring to FIG. 2, a first command is registered during a 10 nanosecond time interval. The first registered command is a bank read and close command addressed to a location in a bank0. Following the bank read time interval tBR (also known as read latency), data read from bank0 is then delivered as a sequence of four data packets. The well-known open-to-close row command period tRAS and precharge time period tRP are also shown. Because all access to the SLDRAM must cease prior to conventional refresh operations, the four packet Auto Refresh command registration is limited by the open-to-close row and precharge time intervals, as shown. Following registration of the Auto Refresh command, further command registration is limited by the refresh command period tRC. Only then can a subsequent access be initiated, such as the depicted read and close operation to a location in a bank2. As shown in FIG. 2, conventional refresh operations in an SLDRAM result in a significant time lapse between registration of successive read commands. Multibank DRAM refresh operations in accordance with the prior art significantly and adversely affect the speed at which consecutive data transfer operations can be performed.

SUMMARY OF THE INVENTION

In accordance with the present invention, a method is provided for refreshing data stored in a multibank memory device. The method includes initiating a refresh operation in a first bank of the memory device while a data transfer operation is being executed in a second bank of the memory device. The refresh operation may itself simply be a read operation, in which any data read from the first bank is then ignored. Another data transfer operation may also be initiated in a third bank while the refresh operation is being executed in the first bank.

In one aspect of the invention, a method is provided in connection with a memory controller that receives data transfer requests directed to a multibank memory. The method includes receiving a refresh request, including an address of a location in a bank. If the bank is idle, the refresh operation is then initiated. If the bank is not idle, initiation of the refresh operation is postponed until the bank is idle. The method may also include determining whether the refresh request has priority over any other pending requests.

In another aspect of the invention, a method is provided for controlling refresh operations in a multibank memory that registers commands and requires a minimum command time interval between successive registration of commands addressed to the same bank. The method includes registering a first command addressed to a first bank, and then registering a refresh command addressed to a second bank prior to elapse of the command time interval for the first bank. The method may also include registering a second command addressed to a third bank prior to elapse of the command time interval. Registering the refresh command may include registering a read command.

DETAILED DESCRIPTION OF THE INVENTION

The following describes a novel method for controlling refresh operations of a dynamic random access memory device included in, for example, a computer system. Certain details are set forth to provide a sufficient understanding of the present invention. However, it will be clear to one skilled in the art that the present invention may be practiced without these particular details. In other instances, well-known circuits, control signals, timing protocols, and software operations have not been shown in detail in order to avoid unnecessarily obscuring the invention.

Figure 3:
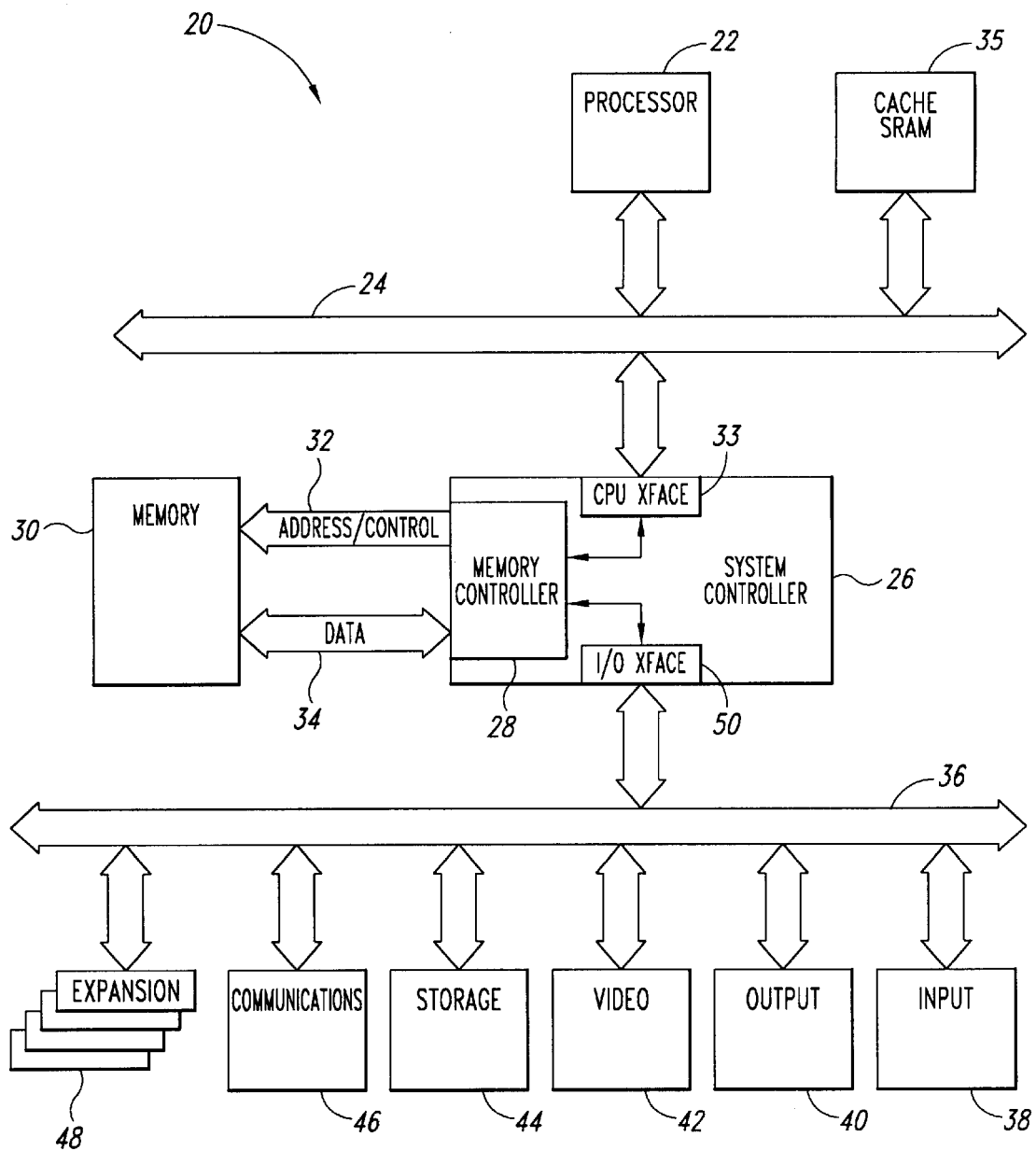
FIG. 3 is a functional block diagram of a computer system adapted to perform a method in accordance with an embodiment of the present invention.

FIG. 3 shows a computer system 20 that is adapted to perform a method in accordance with an embodiment of the present invention. The central processing unit (CPU), such as a microprocessor 22, is coupled with a system controller 26 (also known as corelogic) by a host or processor bus 24 that carries address, data, and control signals therebetween. The system controller 26 includes a memory controller 28 for accessing a main memory 30 via a memory address/control bus 32 and a memory data bus 34. The microprocessor 22 may be any of a wide variety of processors, such as Pentium-type processors manufactured by Intel or other x86-type architecture processors manufactured by AMD, Cyrix, and others. The main memory may include any of a wide variety of multibank DRAMs. Examples include DRAMs manufactured by Micron Technology, Inc., such as SDRAMs, SLDRAMs, etc. If the main memory 30 is populated by SDRAMs, the address/control bus 32 would typically be implemented as separate address and control buses, as is well known by those skilled in the art. If the main memory is populated by SLDRAMs, the address/control bus 32 is then a single bus adapted for transmission of command and address packets, as is well known to those skilled in the art.

The system controller 26 also includes CPU interface circuitry 33 that couples the microprocessor 22 with other components of the system controller, such as the memory controller 28. The system controller 26 also includes a cache controller (not shown) for controlling data transfer operations to a cache memory 35 that provides higher speed access to a subset of the information stored in the main memory 30. The cache memory 35 may include any of a wide variety of suitable high-speed memory devices, such as static random access memory (SRAM) modules manufactured by Micron Technology, Inc.

The system controller 26 also functions as a bridge circuit (sometimes called the host bus bridge or North bridge) between the processor bus 24 and a system bus, such as I/O bus 36. The I/O bus 36 may itself be a combination of one or more bus systems with associated interface circuitry (e.g., AGP bus and PCI bus with connected SCSI and ISA bus systems). Multiple I/O devices 38–46 are coupled with the I/O bus 36. Such I/O devices include a data input device 38 (such as a keyboard, mouse, etc.), a data output device 40 (such as a printer), a visual display device 42 (commonly coupled with the system controller 26 via a high-speed PCI or AGP bus), a data storage device 44 (such as a disk drive, tape drive, CD-ROM drive, etc.), and a communications device 46 (such as a modem, LAN interface, etc.). Additionally expansion slots 48 are provided for future accommodation of other I/O devices not selected during the original design of the computer system 20.

FIG. 3 depicts the various I/O devices 38–46 as being coupled with the controller via single, shared I/O bus 36 and an I/O interface 50 integrated within the system controller. However, those skilled in the art will understand that the depicted I/O interface 50 represents one or more I/O interfaces, as appropriate to a particular computer system design. Also, the I/O bus 36 may itself be a multiple bus and bridge network. Those skilled in the art will understand, therefore, that the depiction of FIG. 3 encompasses any of a wide variety of suitable interconnection structures between the I/O devices 38–46 and other components of the computer system 20. Likewise, the computer system 20 could include multiple processors with multiple host bus bridges and multiple memories with associated memory controllers. Therefore, those skilled in the art will understand the particular depiction of FIG. 3 to encompass any of a wide variety of computer system architectures.

Figure 4:
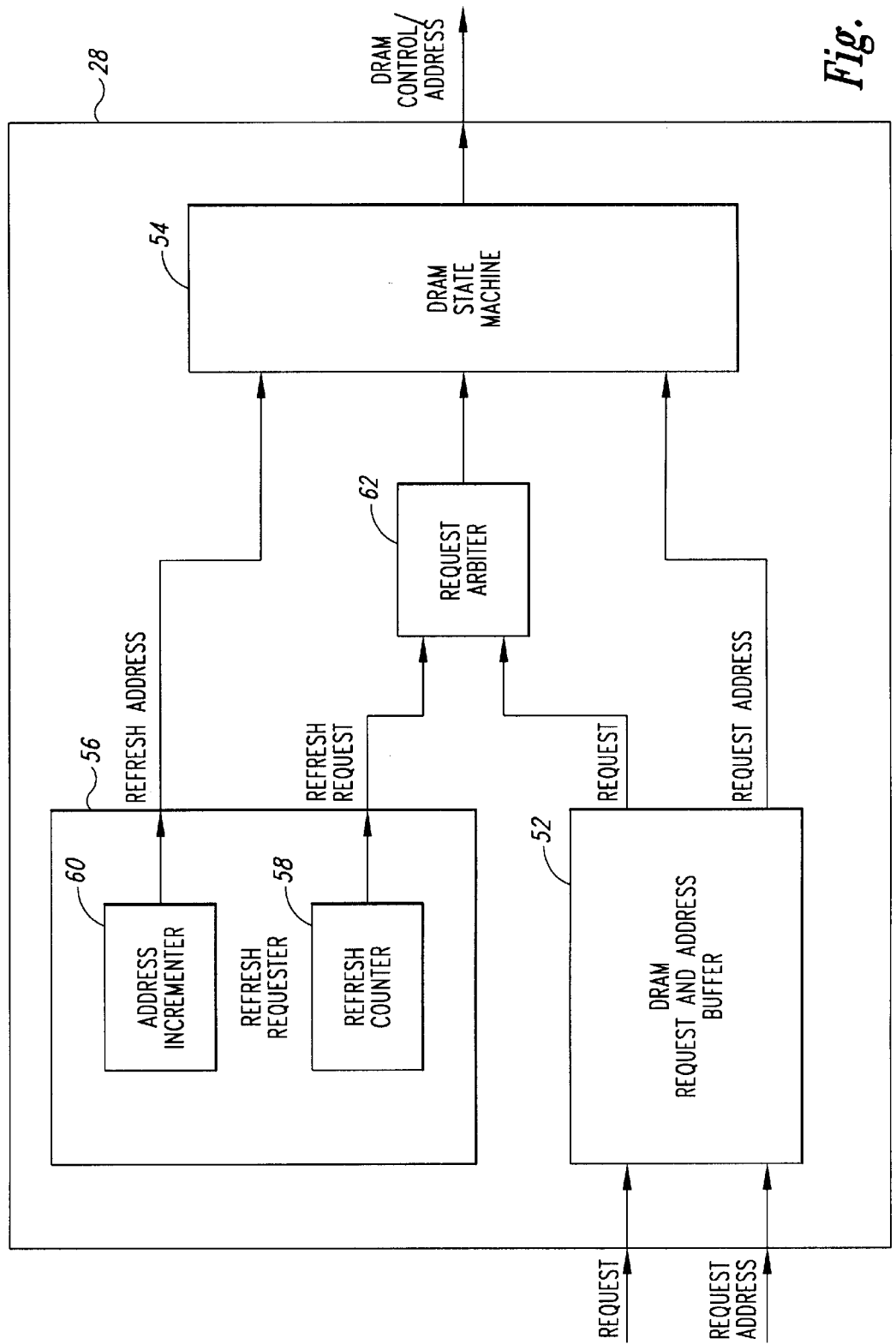
FIG. 4 is a functional block diagram depicting a memory controller included in the computer system of FIG. 3.

FIG. 4 is a functional block diagram depicting portions of the memory controller 28. The memory controller 28 receives a Request and associated Request Address from circuitry, such as from the CPU interface 33 or the I/O interface 50 in response to corresponding signals produced by the microprocessor 22 or one of the I/O devices 38–46 (see FIG. 3). Typically, the Request is for a memory read or write operation, but may instead be a specialized operation used, for example, during computer system initialization. Each Request and associated Request Address is first stored in a request buffer or queue 52. Requests stored in the buffer 52 may then be reorganized or prioritized to optimize data transfer operation speed or other parameters, as is well known to those skilled in the art of multibank memory controller design.

The memory controller 28 includes a DRAM state machine 54 that receives a Request and associated Request Address from the request buffer 52 and produces the well-known control signal sets and sequences to initiate the corresponding memory access operations. The particular control signal types and protocols of the DRAM state machine 54 vary, depending on the particular multibank memory device types populating the main memory 30 (see FIG. 3). For an SDRAM, example control signals include the row address strobe (RAS), column address strobe (CAS), write enable (WE), and chip select (CS) signals. For an SLDRAM, example control signals include the packet-defined control/address signals that, for example, indicate device identification, command code, bank address, row address, and column address values. Details of the various control signals and protocols are well known to those skilled in the art and need not be described herein.

The memory controller 28 also includes refresh request circuitry 56. The refresh request circuitry 56 includes a refresh counter 58, which functions as a timer indicating the need for a next refresh operation. The refresh counter 58 selectively asserts a Refresh Request signal, and an address incrementer 60 provides the associated Refresh Address. Both the Request output by the request buffer 52 and the Refresh Request produced by the refresh counter 58 are provided to a request arbiter 62 that selectively passes one or the other of the requests to the DRAM state machine 54. The DRAM state machine 54 also receives the Refresh Address produced by the address incrementer 60, which address is then used by the DRAM state machine to produce the control signal sets and sequences to initiate memory refresh operations. As is known to those skilled in the art, reading data from a particular location in a DRAM necessarily refreshes the data stored at that location. Therefore, the refresh operations initiated by the DRAM state machine 54 can simply be the same as the control signal type and sequence associated with read operations.

Figure 5:
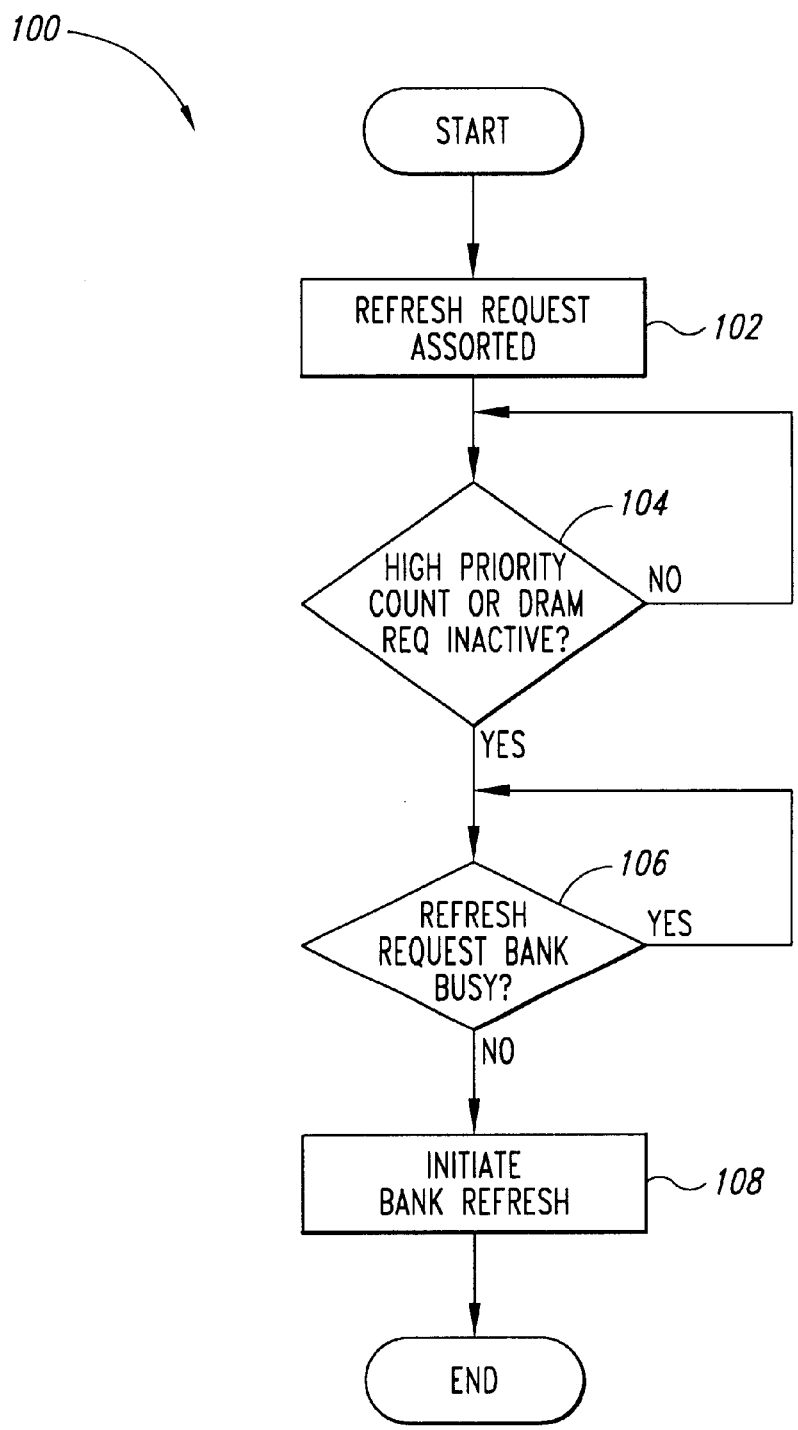
FIG. 5 is a process flow diagram depicting a method of controlling refresh operations in accordance with an embodiment of the present invention.

FIG. 5 is a process flow diagram depicting a method 100 of operating a multibank memory device in accordance with an embodiment of the present invention. Operations begin upon the Refresh Request signal being asserted at step 102. In step 104, it is determined whether there is another pending Request or whether the Refresh Request has an override priority. This determination can be accomplished by any of a number of suitable techniques and according to well-known priority protocols. However, the currently preferred embodiment omits step 104 entirely, with an asserted Refresh Request being given priority over any other Request. In step 106, it is determined whether the bank to which the Refresh Request is addressed is currently busy. This is done with standard bank conflict protocols, as is well understood by those skilled in the art of interleaved multibank memory controller design. Once it has been determined that the addressed bank is not busy, refresh operations are then initiated to that bank in step 108. Operations associated with the method 100 then cease pending subsequent assertion of another Refresh Request.

Figure 1:
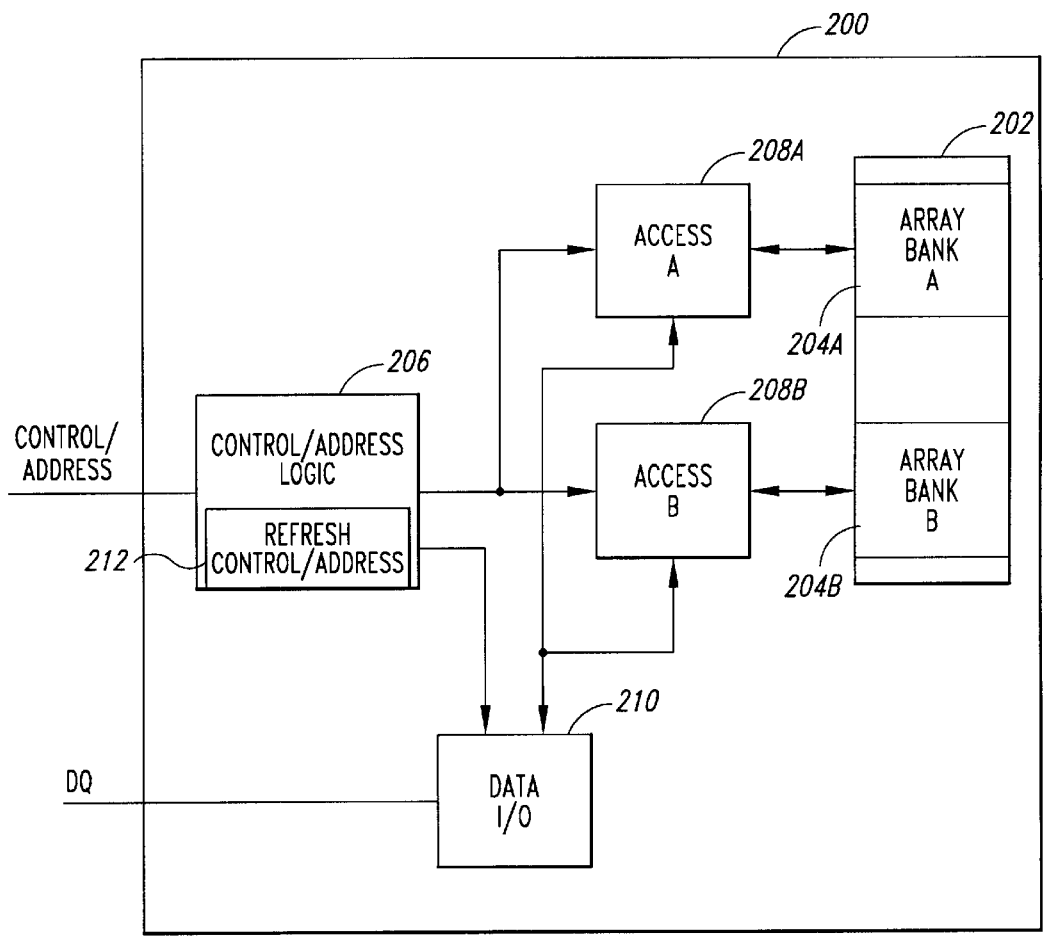
FIG. 1 is a functional block diagram depicting a memory device according to the prior art.
Figure 2:
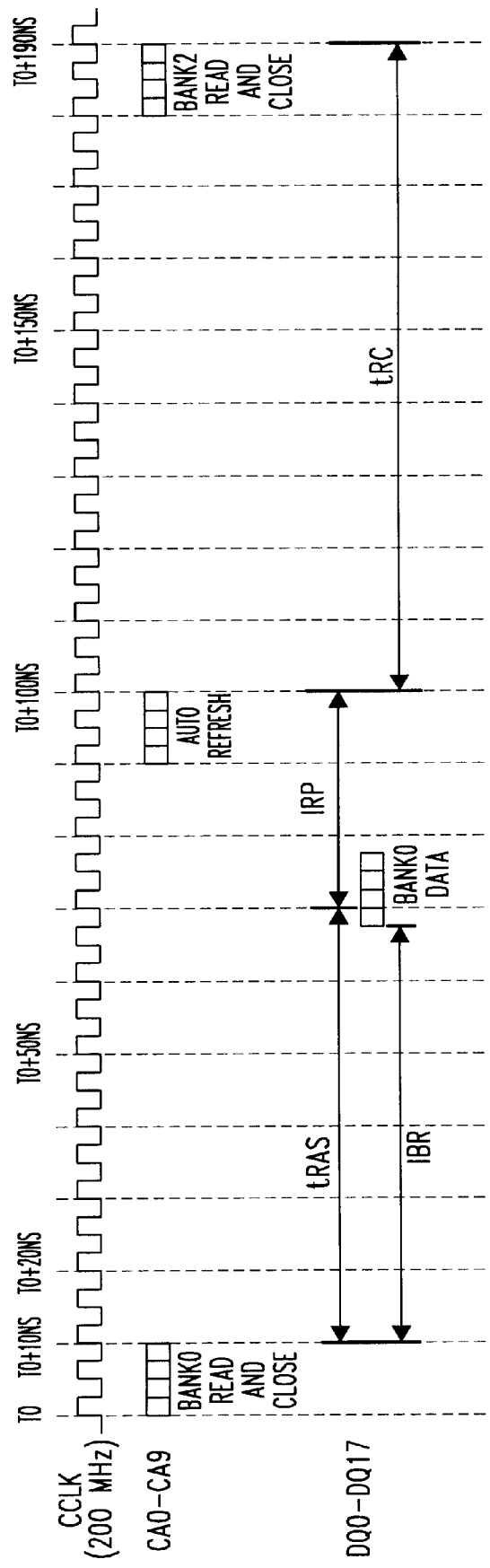
FIG. 2 is a timing diagram depicting SLDRAM operations according to the prior art.
Figure 6:
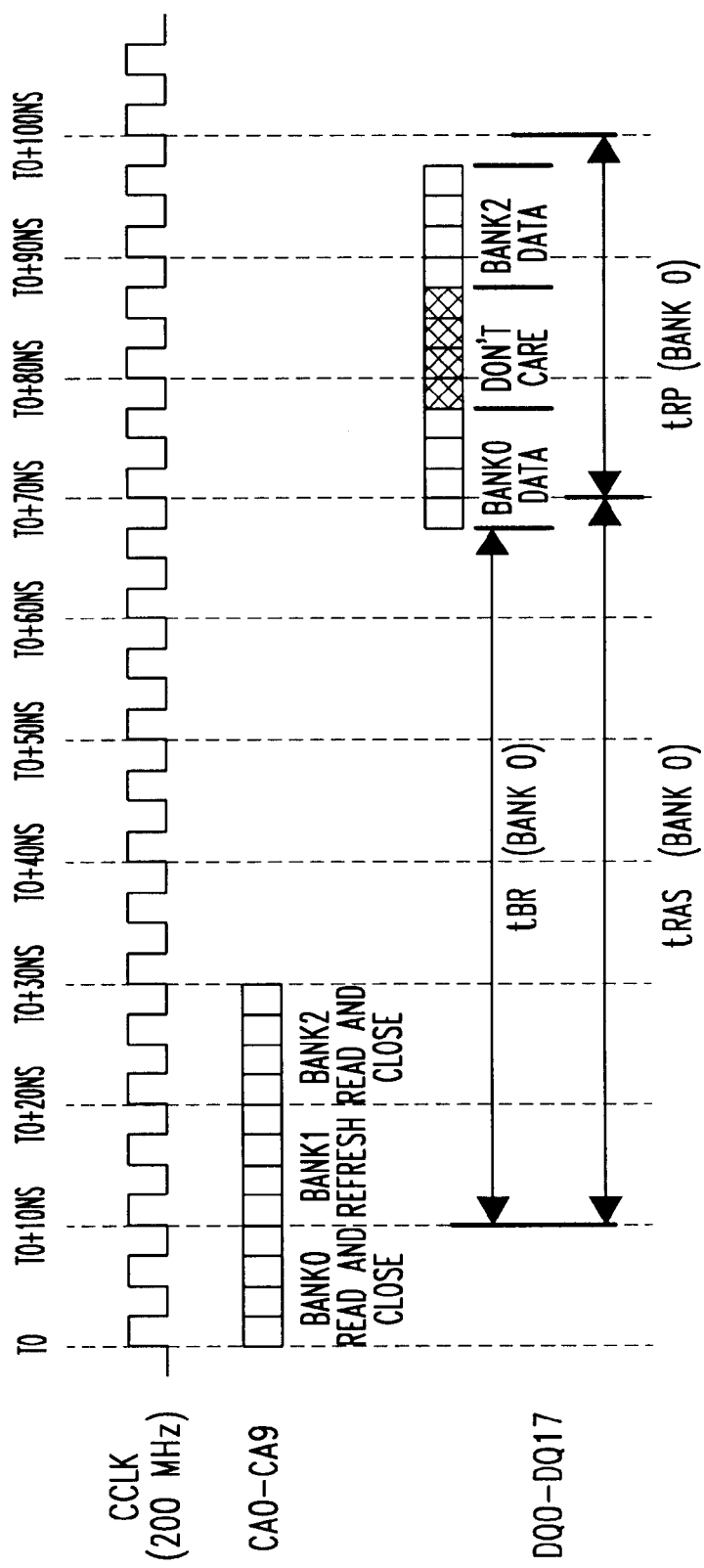
FIG. 6 is a tuning diagram depicting SLDRAM operations in accordance with an embodiment of the present invention.

A number of advantages are provided by the above-described embodiments of the present invention. In particular, because the Refresh Request is passed to the DRAM state machine 54 (see FIG. 4) in the same way that a typical read or write request is passed, refresh operations can then be interleaved with other bank operations, without the refresh time penalties associated with conventional multibank memory controllers. Referring to FIG. 6, a timing diagram depicts SLDRAM refresh operations in accordance with an embodiment of the present invention. The time lapse between successive read operations shown in FIG. 6 stands in marked contrast to that of prior art FIG. 2. For example, the read command packet directed to a bank0, a refresh command packet directed to a bank1, and the read command packet directed to a bank2 can be registered without the idle time intervals shown in FIG. 2. Whereas the time interval between registration of the bank0 and bank2 commands in FIG. 2 is 180 nanoseconds, the present invention provides a time interval of merely 10 nanoseconds between these accesses. Refresh of the address location in bank1 can simply be accomplished by performing a bank1 read and close operation, with the associated data read from bank1 then being ignored by the memory controller 28.

Those skilled in the art will appreciate that the present invention may be accomplished with circuits other than those particularly depicted and described in connection with FIGS. 3 and 4. These figures represent just one of many possible circuit implementations of a multibank memory control method in accordance with the present invention. Likewise, the present invention may be accomplished using process steps other than those particularly depicted and described in connection with FIG. 5. Those skilled in the art will also understand that each of the circuits whose function, method of operation, and interconnection are described in connection with FIGS. 3 and 4 is of a type known in the art. Therefore, one skilled in the art will be readily able to adapt such circuits in the described combination to practice the invention. Particular details of these circuits are not critical to the invention, and a detailed description of the internal circuit operation need not be provided. Similarly, each one of the process steps described in connection with FIG. 5 is of a type well known in the art, and may itself be a sequence of operations that need not be described in detail in order for one skilled in the art to practice the invention.

It will be appreciated that, although specific embodiments of the invention have been described for purposes of illustration, various modifications may be made without deviating from the spirit and scope of the invention. Those skilled in the art will appreciate that many of the advantages associated with these circuits and processes described above may be provided by other circuit configurations and processes. Indeed, a number of suitable circuit components can be adapted and combined in a variety of circuit topologies to implement methods of controlling multibank memories in accordance with the present invention. Those skilled in the art will also appreciate that various terms used in the description above are sometimes used with somewhat different, albeit overlapping, meanings. For example, the term "bank" may refer solely to a memory array bank, or may refer both to an array bank and its associated access circuitry. The term "request" or "command" may refer solely to a request or command type (e.g., read or write), or may refer also to the associated address to which the request or command is directed. Therefore, terms used in the following claims shall be construed to include any of the various meanings known to those skilled in the art. Accordingly, the invention is not limited by the particular disclosure above, but instead the scope of the invention is determined by the following claims.

What is claimed is:

1. A method of refreshing data stored in a multibank memory device, comprising:
   initiating a first data transfer operation to a first bank of the memory device; and
   while the first data transfer operation is being executed, providing a refresh address corresponding to a location in a second bank of the memory device and initiating a refresh operation in the second bank of the memory device to refresh the location.

2. A method according to claim 1, further comprising initiating a second data transfer operation to a third bank of the memory device while the refresh operation is being executed.

3. A method according to claim 1 wherein initiating the first data transfer operation includes initiating a read operation.

4. A method according to claim 1 wherein initiating the refresh operation includes initiating a read operation.

5. A method according to claim 1 wherein prior to initiating the refresh operation, the method comprises determining if the second bank is precharged.

6. In a memory controller operable to receive data transfer requests directed to a memory having a plurality of banks, a method of controlling memory refresh operations, comprising:

initiating data transfer operations to a first of the banks;

and receiving a refresh address corresponding to memory located in a second of the banks and further receiving a refresh request directed to the second of the banks;

determining whether the second bank is idle; and if the second bank is idle, then initiating refresh operations during execution of the data transfer operations.

7. A method according to claim 6 wherein if the second bank is not idle, then the method further comprises waiting until the second bank is idle to initiate refresh operations.

8. A method according to claim 6 wherein initiating refresh operations includes initiating read operations.

9. A method according to claim 6 wherein prior to determining whether the second bank is idle, the method comprises determining whether the refresh request has priority over pending data transfer requests.

10. A method according to claim 6 wherein prior to determining whether the addressed location is in a bank that is idle, the method comprises determining whether data transfer requests are pending.

11. A method according to claim 6 wherein receiving the refresh request includes generating the refresh request internal to the memory controller.

12. A method according to claim 6 wherein the data transfer operations are first data transfer operations, and further comprising initiating second data transfer operations to a third of the banks during execution of the refresh operations.

13. A method of controlling refresh operations in a memory having a plurality of banks, the memory operable to register commands and requiring a minimum command time interval between successive registration of commands addressed to a same one of the banks, the method comprising:

registering a first command addressed to a first one of the banks; and prior to elapse of the command time interval, registering a refresh command addressed to a location corresponding to a refresh address within a second one of the banks.

14. A method according to claim 13 wherein registering the first command includes registering a read command.

15. A method according to claim 13 wherein registering the refresh command includes registering a read command.

16. A method according to claim 13, further comprising registering a second command addressed to a third one of the banks prior to elapse of the command time interval.

17. A method of refreshing data stored in a multibank memory device, comprising:

executing a memory access operation to access a first bank of the memory device;

while the first data transfer operation is executing, providing a refresh address corresponding to a location in a second bank of the memory device and issuing a refresh operation to the second bank of the memory device to refresh the location.

18. The method of claim 17, further comprising determining whether the second bank is idle and executing the refresh operation when the second bank is determined to be idle.

19. The method of claim 18, further comprising determining whether data transfer requests are pending prior to determining whether the second bank is idle.

20. The method of claim 17, further comprising determining whether the refresh request has priority over pending data transfer requests.

21. The method of claim 17 wherein issuing the refresh operation comprises issuing a read operation.

22. The method of claim 17, further comprising initiating second data transfer operations to a third of the banks during execution of the refresh operations.

23. A method of refreshing data stored in a multibank memory device, comprising:

executing a type of memory access operation to access a first bank of the memory device;

while the memory access operation to access the first bank is being executed, providing a refresh address corresponding to a location in a second bank of the memory device;

executing the same type of memory access operation to access the location in the second bank to refresh the location; and ignoring any data accessed from the location.

24. The method of claim 23 wherein the type of memory access operation is a read operation.

25. The method of claim 23, further comprising determining whether the second bank of the memory device is in an idle state.

26. The method of claim 23, further comprising issuing the same type of memory access operation to a third of the banks during execution of the memory access operation to the second bank.

\* \* \* \* \*